(12) United States Patent
Reznicek et al.

(10) Patent No.: US 10,083,964 B1
(45) Date of Patent: Sep. 25, 2018

(54) DOUBLE DIFFUSION BREAK GATE STRUCTURE WITHOUT VESTIGIAL ANTENNA CAPACITANCE

(71) Applicant: International Business Machines Corporation, Armonk, NY (US)

(72) Inventors: Alexander Reznicek, Troy, NY (US); Sivananda Kanakasabapathy, Niskayuna, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/812,249

(22) Filed: Nov. 14, 2017

Related U.S. Application Data

(63) Continuation of application No. 15/634,799, filed on Jun. 27, 2017.

(51) Int. Cl.
| | |
|---|---|
| *H01L 27/092* | (2006.01) |
| *H01L 29/06* | (2006.01) |
| *H01L 21/3065* | (2006.01) |
| *H01L 21/225* | (2006.01) |
| *H01L 21/02* | (2006.01) |
| *H01L 21/762* | (2006.01) |
| *H01L 21/8238* | (2006.01) |
| *H01L 29/66* | (2006.01) |
| *H01L 21/308* | (2006.01) |

(52) U.S. Cl.
CPC .... *H01L 27/0924* (2013.01); *H01L 21/02532* (2013.01); *H01L 21/2252* (2013.01); *H01L 21/308* (2013.01); *H01L 21/3065* (2013.01); *H01L 21/76224* (2013.01); *H01L 21/823821* (2013.01); *H01L 21/823828* (2013.01); *H01L 21/823878* (2013.01); *H01L 29/0649* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 8,846,491 B1 | 9/2014 | Pham et al. | |
| 9,379,106 B2 | 6/2016 | Hong et al. | |
| 9,412,616 B1* | 8/2016 | Xie | H01L 21/76224 |
| 9,653,583 B1* | 5/2017 | Zhao | H01L 29/66795 |
| 9,865,704 B2* | 1/2018 | Xie | H01L 29/66545 |

(Continued)

FOREIGN PATENT DOCUMENTS

EP    1 130 639 A1    9/2001

OTHER PUBLICATIONS

Banna S., "Scaling Challenges of FinFET Technology at Advanced Nodes and its Impact on SoC Design (Invited)", Custom Integrated Circuits Conference (CICC), IEEE (8 pages) (Sep. 28-30, 2015).

(Continued)

*Primary Examiner* — Joseph Schoenholtz
(74) *Attorney, Agent, or Firm* — Scully, Scott, Murphy & Presser, P.C.; Daniel P. Morris, Esq.

(57) ABSTRACT

A double diffusion break (DDB) gate structure is provided by removing the vestigial antenna to provide a space and the space is filled, at least in part, with an interlevel dielectric (ILD) material. Removal of the vestigial antenna from the DDB gate structure will reduce the device capacitance and improve device performance, while enabling DDB in tight integration schemes.

10 Claims, 10 Drawing Sheets

(56) References Cited

U.S. PATENT DOCUMENTS

| | | | |
|---|---|---|---|
| 2015/0054089 A1* | 2/2015 | Hong | H01L 21/762 |
| | | | 257/401 |
| 2016/0093511 A1 | 3/2016 | Sengupta et al. | |
| 2016/0268414 A1* | 9/2016 | Park | H01L 29/785 |
| 2017/0062475 A1* | 3/2017 | Song | H01L 27/11807 |
| 2017/0098641 A1* | 4/2017 | Jung | H01L 21/8234 |
| 2017/0200651 A1* | 7/2017 | Lee | H01L 21/76224 |
| 2018/0006035 A1* | 1/2018 | Yuan | H01L 27/0924 |

OTHER PUBLICATIONS

List of IBM Patents or Patent Applications Treated as Related, dated Nov. 14, 2017, 2 pages.

Moroz, V., et al., "Transistor and Logic Design for 5nm Technology Node", Synopsys Silicon to Software, Semicon Taiwan 2016, Sep. 9, 2016, 38 pages.

Office Action dated Feb. 12, 2018 received in U.S. Appl. No. 15/634,799.

* cited by examiner

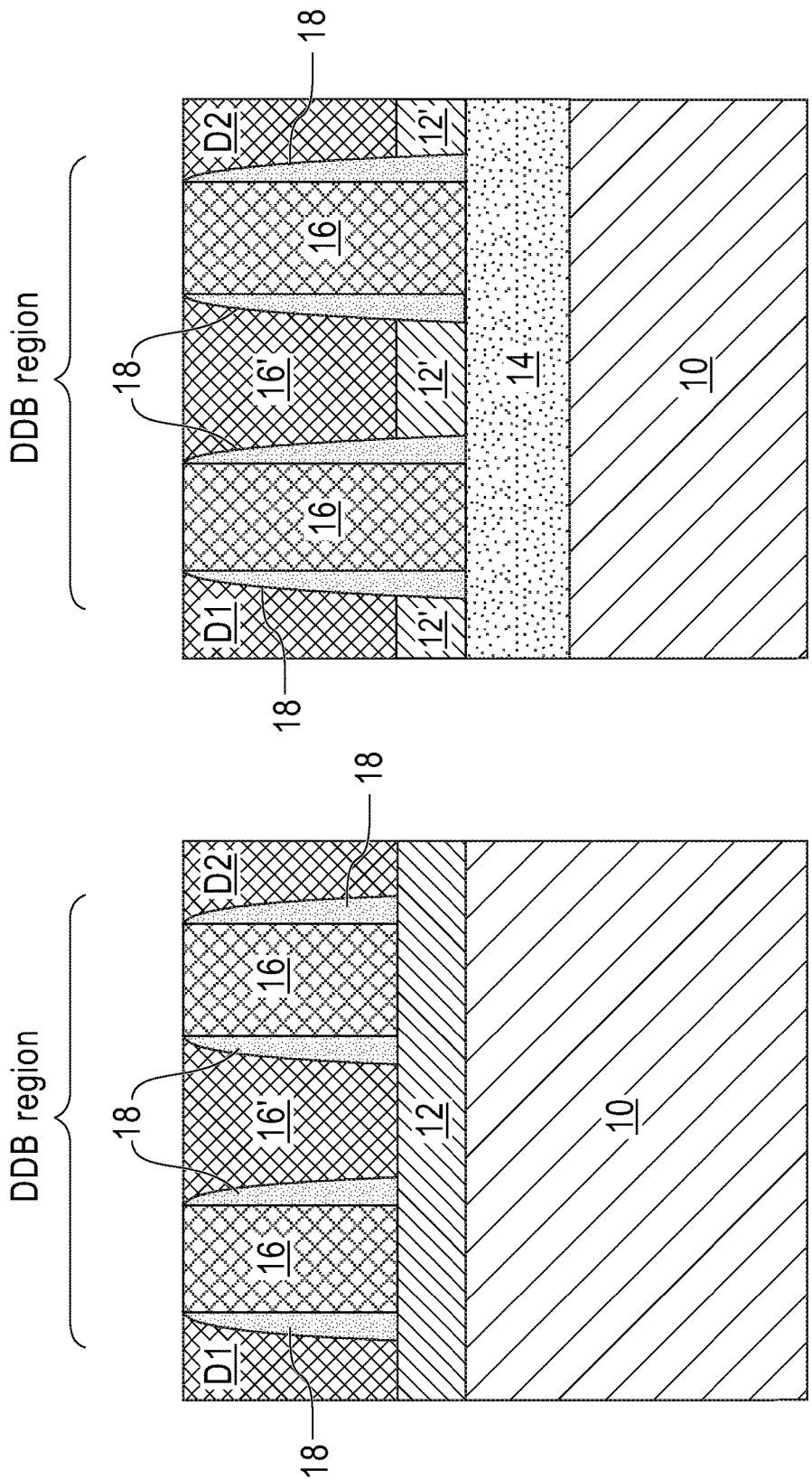

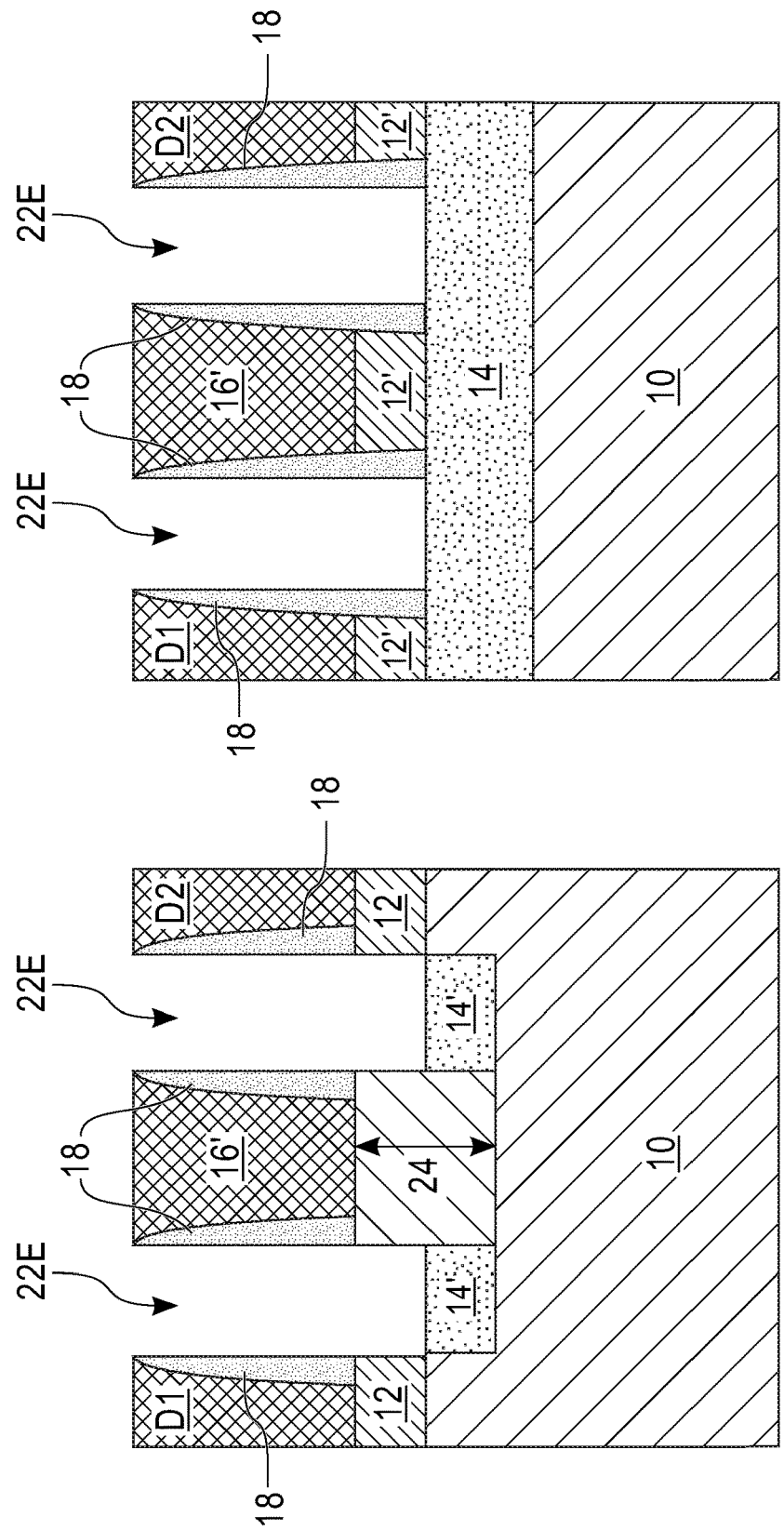

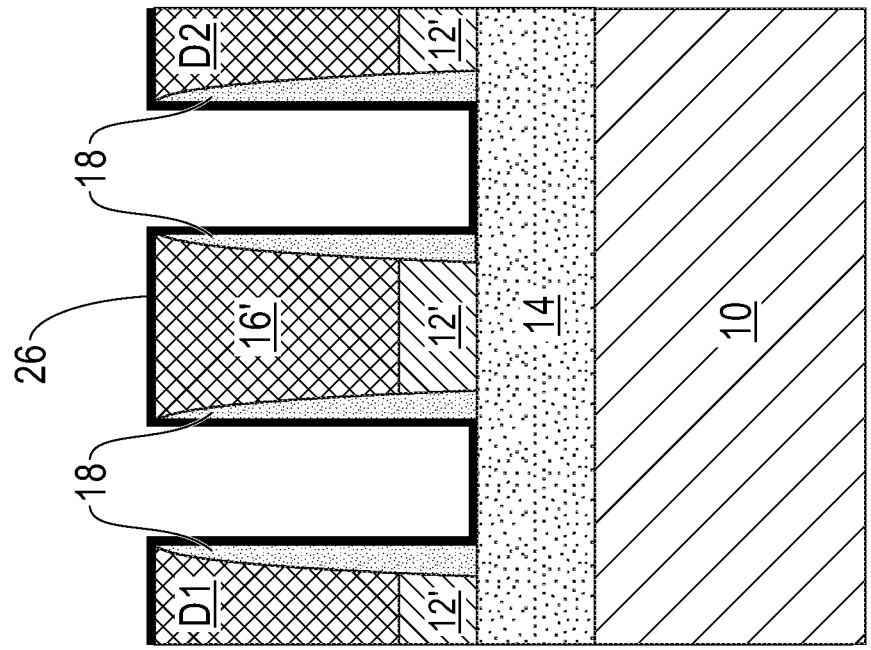
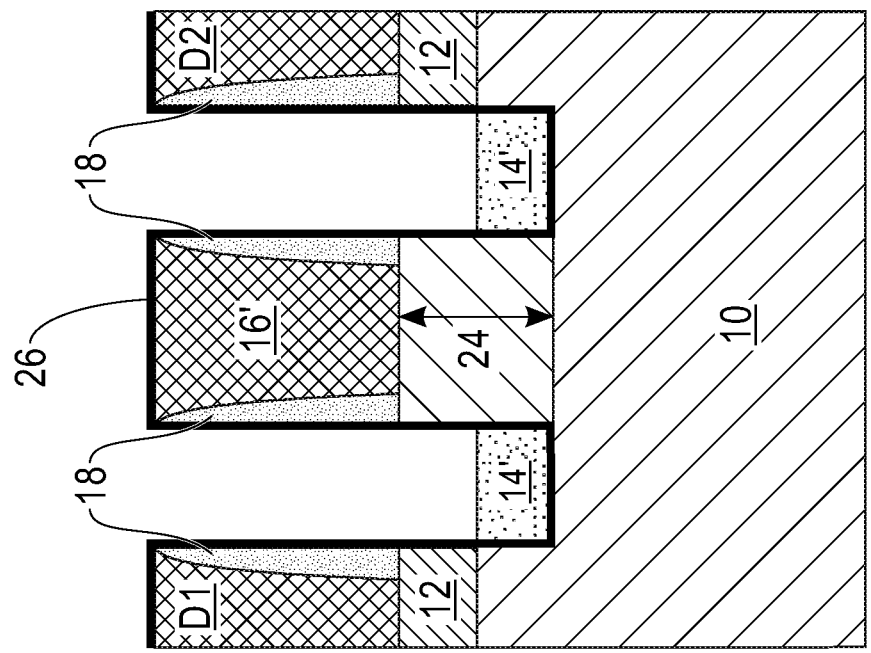

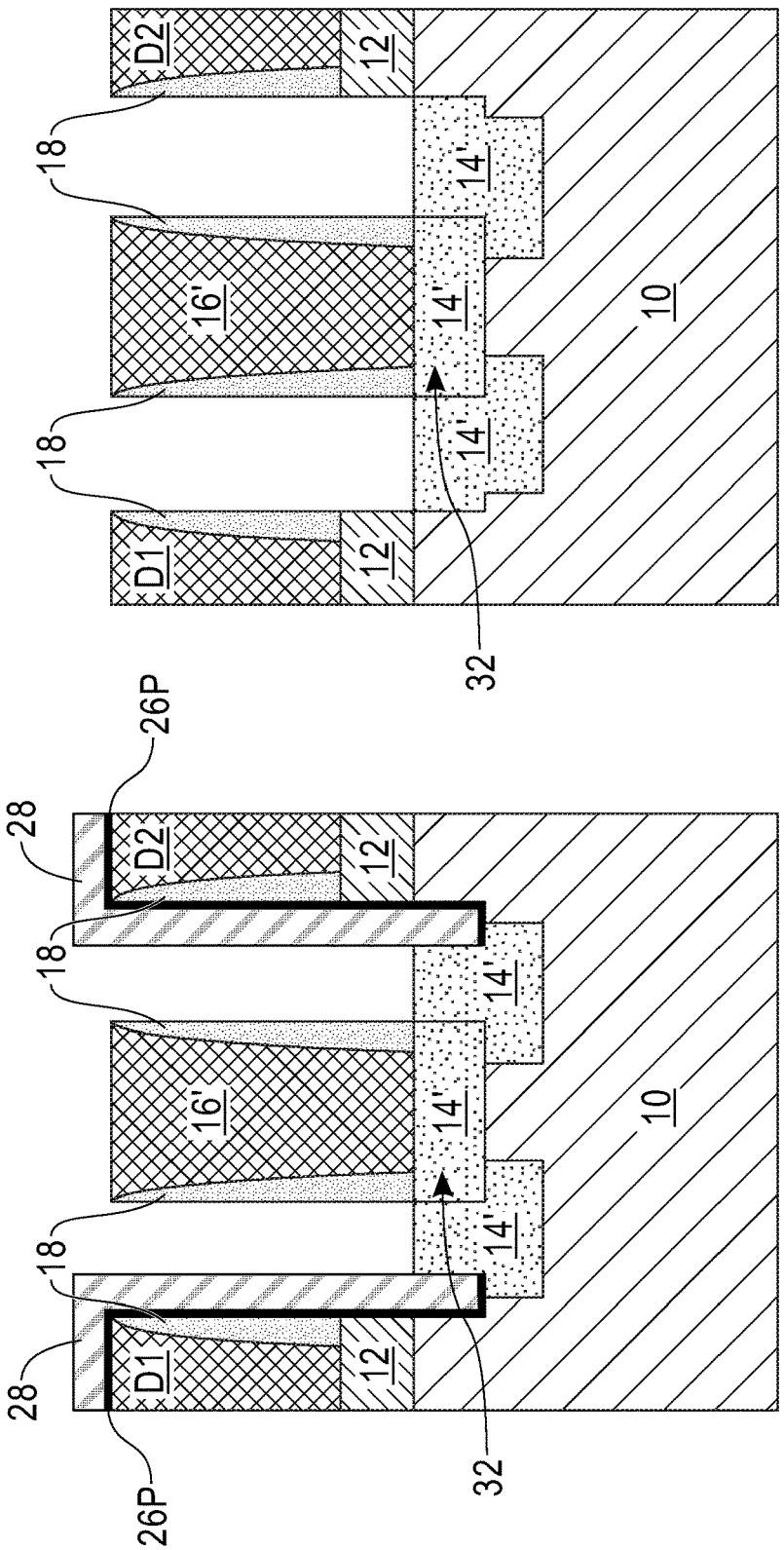

US 10,083,964 B1

DOUBLE DIFFUSION BREAK GATE STRUCTURE WITHOUT VESTIGIAL ANTENNA CAPACITANCE

BACKGROUND

The present application relates to a semiconductor structure and a method of forming the same. More particularly, the present application relates to a double diffusion break gate structure in which the vestigial antenna capacitance is eliminated and a method of forming such a structure.

The combination of replacement gate integration and the need to cut semiconductor fins so as to enable double diffusion break (DDB) gate structures offer a unique opportunity to cut the semiconductor fins post sacrificial gate removal. A DDB gate structure typically includes two sacrificial lines between two separate device regions.

In prior art DDB gate structures, an unused semiconductor fin portion remains in the middle of two gate cuts. The unused semiconductor fin portion that remains in prior art DDB gate structures acts as a vestigial antenna creating additional capacitance. There is thus a need for providing a DDB gate structure in which the vestigial antenna is removed.

SUMMARY

A double diffusion break (DDB) gate structure is provided by removing the vestigial antenna to provide a space and the space is filled, at least in part, with an interlevel dielectric (ILD) material. Removal of the vestigial antenna from the DDB gate structure will reduce the device capacitance and improve device performance, while enabling DDB in tight integration schemes.

In one aspect of the present application, a semiconductor structure is provided. In one embodiment, the semiconductor structure includes a first device region containing a first conductivity type field effective transistor straddling over a channel region of a silicon fin. The structure further includes a second device region containing a second conductivity type field effective transistor straddling over a channel region of a silicon fin. In accordance with the present application, a double diffusion break region is located between the first and second device regions. The double diffusion break region includes a sacrificial gate material and an interlevel dielectric material that is present adjacent to each side of the sacrificial gate material and beneath at least a portion of the sacrificial gate material.

In another aspect of the present application, a method of forming a semiconductor structure is provided. In one embodiment, the method includes providing an initial structure including a first device region defined by a first portion of a silicon fin, and a second device region defined by a second portion of the silicon fin, wherein a double diffusion break region is located between the first and second device regions and defined by a third portion of the silicon fin, wherein the double diffusion break region includes sacrificial gate cut structures which are present between opposing gate spacers, and a sacrificial gate material that is located between each sacrificial gate cut structure. Next, each sacrificial gate cut structure is removed to provide a cavity that physically exposes a portion of the silicon fin in the double diffusion break region. The silicon fin is then cut by removing the physically exposed portions of the silicon fin in each cavity in the double diffusion break region, while maintaining a portion of the silicon fin beneath the sacrificial gate material, wherein the portion of the silicon fin that remains beneath the sacrificial gate material defines a vestigial antenna. Next, the entirety of the vestigial antenna is removed to provide a space beneath the sacrificial gate material. At least a portion of the space beneath the sacrificial gate material and an entirety of each cavity are then filled with an interlevel dielectric material.

BRIEF DESCRIPTION OF SEVERAL VIEWS OF THE DRAWINGS

FIG. 2A is a cross sectional of an exemplary semiconductor structure that can be employed in accordance with an embodiment of the present application; this cross section is parallel to the silicon fins and is through line A-A as shown in FIG. 1.

FIG. 2B is a cross sectional of an exemplary semiconductor structure that can be employed in accordance with an embodiment of the present application; this cross section is parallel to the silicon fins and is through line B-B as shown in FIG. 1.

FIG. 4A is a cross sectional view of the exemplary semiconductor structure of FIG. 3A after cutting physically exposed portions of the silicon fins in the DDB region, wherein a vestigial antenna remains in the middle of the double diffusion break diffusion region.

FIG. 4B is a cross sectional view of the exemplary semiconductor structure of FIG. 3B after cutting physically exposed portions of the silicon fins in the DDB region, wherein a vestigial antenna remains in the middle of the double diffusion break diffusion region.

FIG. 5A is a cross sectional view of the exemplary semiconductor structure of FIG. 4A after forming a dielectric material liner.

FIG. 5B is a cross sectional view of the exemplary semiconductor structure of FIG. 4B after forming a dielectric material liner.

FIG. 11 is a cross sectional view of the exemplary semiconductor structure of FIG. 10 after removing the entirety of the SiGe vestigial antenna.

FIG. 12 is a cross sectional view of the exemplary structure of FIG. 11 after removing the vestigial antenna removal mask and the remaining portions of the dielectric material liner.

DETAILED DESCRIPTION

Figure 1:
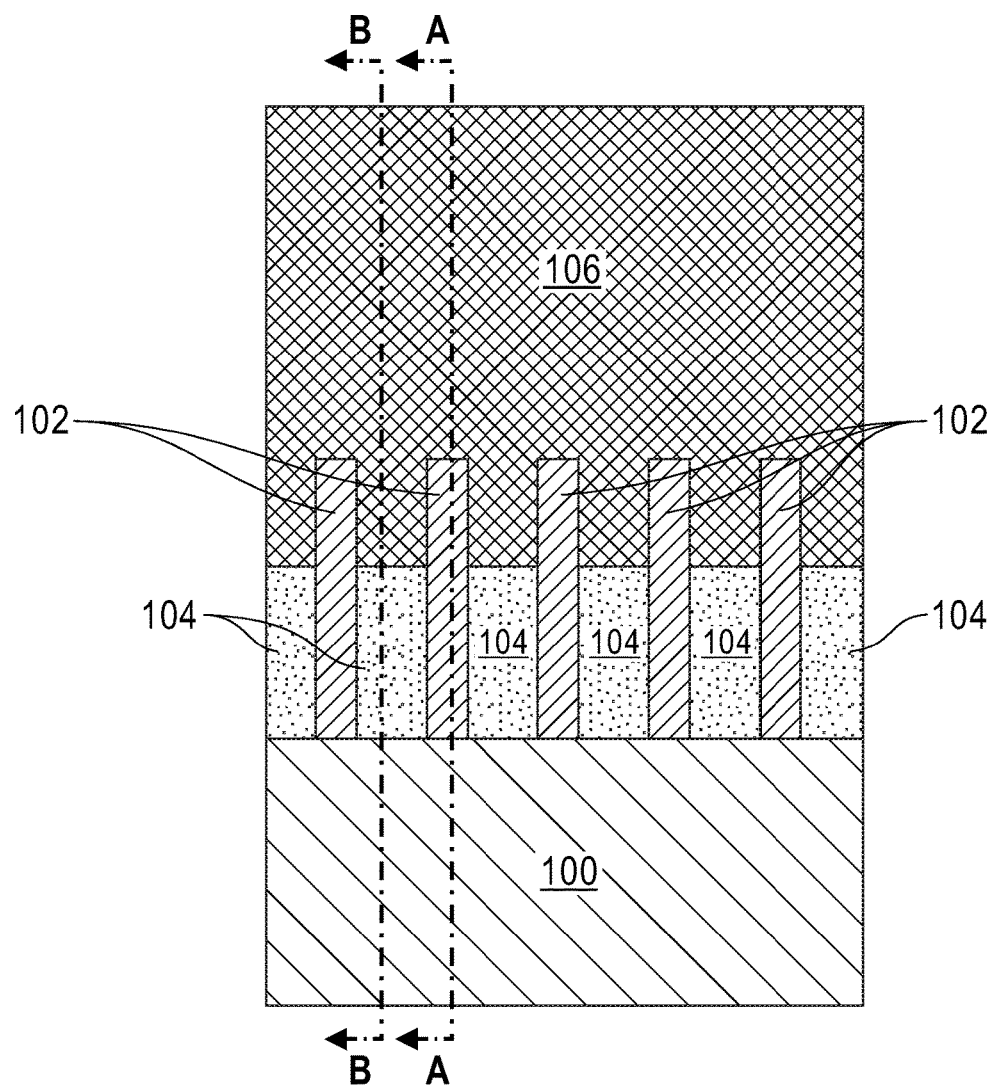
FIG. 1 is a cross sectional view of an exemplary semiconductor structure and perpendicular to a plurality of silicon fins showing line A-A and B-B.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a cross sectional view of an exemplary semiconductor structure and perpendicular to a plurality of silicon fins 102 showing line A-A and B-B. Line A-A of FIG. 1 is in a silicon fin, while line B-B of FIG. 1 is between a neighboring pair of silicon fins. This drawing is provided for illustration purposes only and for further understanding the remaining drawings of the present application. The exemplary structure further includes substrate 100 in which the plurality of silicon fins 102 extend upward from, an isolation structure 104 located between a lower portion of each silicon fin 102 and a sacrificial gate material 106 located between an upper portion of each silicon fin 102 and atop each silicon fin 102.

Referring first to FIGS. 2A-2B, there are shown various cross sectional views of an exemplary semiconductor structure that can be employed in accordance with an embodiment of the present application. The cross section shown in FIG. 2A is parallel to the silicon fins and is through line A-A as shown in FIG. 1, while the cross section shown in FIG. 2B is parallel to the silicon fins and is through line B-B as shown in FIG. 1. The exemplary semiconductor structure of FIGS. 2A and 2B are formed utilizing any well known replacement gate process.

The exemplary semiconductor structure of FIGS. 2A and 2B highlights the DDB region of a DBB gate structure prior to cutting the silicon fins; the DDB region is located between a first device region, D1, and a second device region, D2. The first device region D1 is defined by a first portion of the silicon fin 12, the second device region is defined by a second portion of the silicon fin 12, and the DDB region is defined by a third portion of the silicon fin 12. The exemplary semiconductor structure shown in FIGS. 2A-2B includes a substrate 10 that contains a plurality of silicon fins that extend upward from the surface of a substrate 10. Substrate 10 may be an insulator layer or a remaining silicon portion of a bulk silicon substrate.

In each drawing, a single silicon fin (12/12') is shown; element 12' denotes that the silicon fin 12 is the background. Each silicon fin 12/12' can be formed utilizing well known patterning techniques such as, for example, sidewall image transfer (SIT), lithography and etching, or directional self-assembly (DSA). In one embodiment, the patterning is performed on a bulk silicon substrate, while in another embodiment, the patterning is performed on a silicon-on-insulator substrate (SOI). The term "silicon fin" denotes a contiguous silicon structure that extends upward from a surface of substrate 10 and has a pair of vertical sidewalls that are parallel to each other. As used herein, a surface is "vertical" if there exists a vertical plane from which the surface does not deviate by more than three times the root mean square roughness of the surface. The height and width of each silicon fin can vary. For example, each silicon fin 12/12' may have a height ranging from 10 nm to 100 nm, and a width ranging from 4 nm to 30 nm.

The exemplary semiconductor structure of FIGS. 2A and 2B also includes an isolation structure 14 that is located between each silicon fin of the plurality silicon fins (this is shown in FIG. 1). The isolation structure 14 can be formed by deposition of a dielectric material such as, for example, silicon dioxide. This deposition is performed after silicon fin formation. In some embodiments, and following the deposition of the dielectric material that provides the isolation structure, an upper portion of the deposited dielectric material may be removed utilizing an etch back process. The isolation structure 14 has a bottommost surface that directly contacts a topmost surface of the substrate 10, and a topmost surface that is located beneath a topmost surface of each silicon fin.

The exemplary semiconductor structure of FIGS. 2A and 2B also includes a first device region, D1, and a second device region D2. The first device region, D1, includes components of a first conductivity type field effect transistor (FET), while the second device region, D2, includes components of a second conductivity type field effect transistor (FET), wherein the second conductivity type is different from the first conductivity type. For example, the first conductivity type FET may be an n-FET, while the second conductivity type FET may be a p-type FET. In another example, the first conductivity type FET may be a p-FET, while the second conductivity type FET may be an n-type FET. Each FET includes a functional gate structure that straddles over a portion of each silicon fin. By "straddles" it is meant that the functional gate structure formed in each device region is in direct contact with a top surface and two vertical sidewalls of a channel region of each silicon fin. The term "functional gate structure" as used herein refers to a permanent gate structure used to control output current (i.e., flow of carriers in the channel) of a semiconducting device through electrical fields or magnetic fields. Each functional gate structure may include any well known gate dielectric material and any well known gate conductor material. The functional gate structures present in each of the first and second device regions (D1 and D2) can be formed utilizing any well known replacement gate process. In a replacement gate process, sacrificial gate structures are formed straddling over different portions of each silicon fin. Gate spacers are then typically formed along the sidewalls of each of the sacrificial gate structures by deposition of a dielectric spacer material such as, for example, silicon nitride, and then etching. The sacrificial gate structures in the various device regions (i.e., D1 and D2) are then replaced with a functional gate structure.

In exemplary semiconductor structure of FIGS. 2A and 2B, gate spacers 18 are shown in the DDB region that is present between the first and second device regions (D1 and D2). Also, present in the DDB region are sacrificial gate cut structures 16 which are present in a cavity between opposing gate spacers 18, and a sacrificial gate material 16' that is located outside of the cavity between the opposing sacrificial gate cut structures 16. The sacrificial gate cut structures 16 and the sacrificial gate material 16' are of composed of same sacrificial gate material such as, for example, polysilicon.

Figures 3A, 3B:
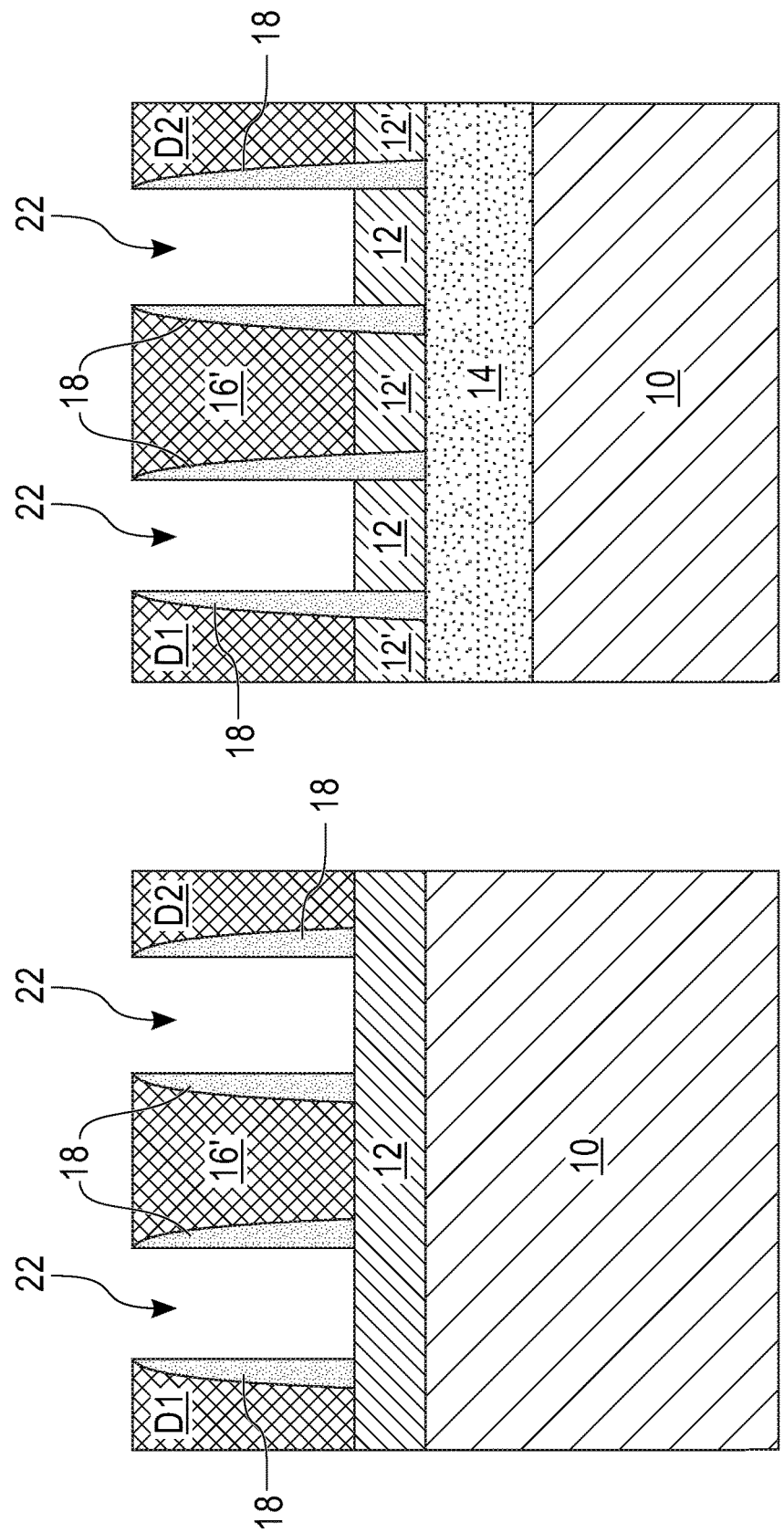
FIG. 3A is a cross sectional view of the exemplary semiconductor structure of FIG. 2A after removing the sacrificial gate cut structures in a DDB region in which the silicon fins have to be cut.
FIG. 3B is a cross sectional view of the exemplary semiconductor structure of FIG. 2B after removing the sacrificial gate cut structures in a DDB region in which the silicon fins have to be cut.

Referring now to FIGS. 3A-3B, there are illustrated the exemplary semiconductor structure of FIGS. 2A-2B, respectively, after removing sacrificial gate cut structures 16 in the DDB region in which the silicon fins 12 have to be cut. The removal of each sacrificial gate cut structures 16 in the DDB region provides a cavity 22 between opposing gate spacer 18. Each cavity 22 exposes a portion of each silicon fin 12. Each cavity 22 has a first depth.

The removal of the sacrificial gate cut structures 16 is performed utilizing an anisotropic etching process that is selective for removing the material of the sacrificial gate cut structure 16. The removing of the sacrificial gate cut structures 16 may be performed utilizing a mask (not shown).

Referring now FIGS. 4A-4B, there are illustrated the exemplary semiconductor structure of FIGS. 3A-3B, respectively, after cutting the physically exposed portions of the silicon fin 12 in the DDB region, wherein a vestigial antenna 24 remains in the middle of the double diffusion break diffusion DDB region; the vestigial antenna is composed of a remaining portion of the silicon fin.

The cutting of the physically exposed portions of each silicon fin 12 in the DDB region provides an extended cavity 22E that extends to the surface of the isolation structure 14; in FIG. 4A, element 14' denotes that the isolation structure is in the background. The cutting of the physically exposed portions of the silicon fin 12 may be performed utilizing another anisotropic etching process that is selective in removing silicon. Each extended cavity 22E has a second depth that is greater than the first depth.

Referring now to FIGS. 5A-5B, there are illustrated the exemplary semiconductor structure of FIGS. 4A-4B, respectively, after forming a dielectric material liner 26. Dielectric material liner 26 is a continuous liner that is formed on all exposed surfaces of the exemplary semiconductor structure of FIGS. 4A-4B including, for example, on exposed surfaces in the first and second device regions (D1 and D2), and on exposed surfaces in the DDB region including within each extended cavity 22E and atop the sacrificial gate material 16'. Dielectric material liner 26 is composed of a different dielectric material that either the dielectric material that provides the isolation structure 14 and the dielectric material that provides the gate spacers 18. In one embodiment, dielectric material liner 26 is a dielectric material having a dielectric constant of 8 or greater and is selected from a dielectric metal oxide such as hafnium dioxide.

The dielectric material liner 26 can be formed utilizing a deposition process such, as for example, chemical vapor deposition, plasma enhanced chemical vapor deposition or physical vapor deposition. The dielectric material liner 26 may be a conformal liner or a non-conformal liner. By "conformal" it is meant that a material has a same thickness along a vertical direction and a horizontal direction. In one embodiment, dielectric material liner 26 may have a thickness from 2 nm to 10 nm.

Figure 6B:
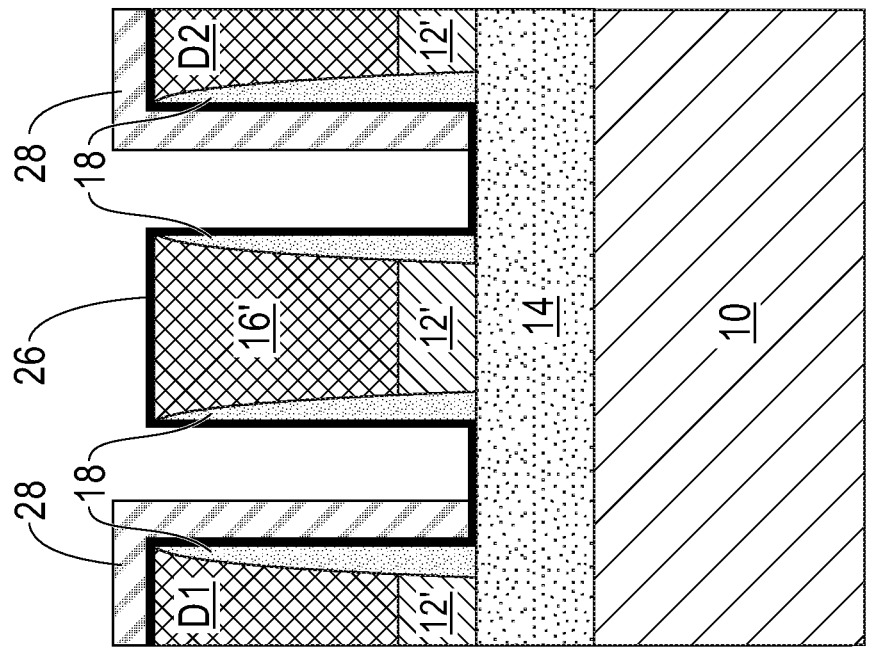
FIG. 6B is a cross sectional view of the exemplary semiconductor structure of FIG. 5B after forming a vestigial antenna removal mask.
Figure 6A:
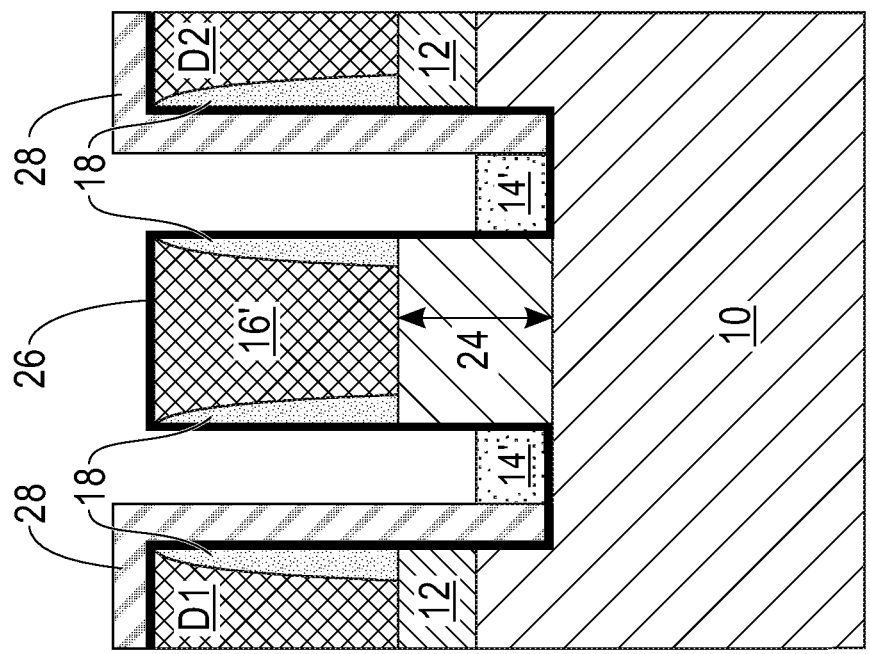
FIG. 6A is a cross sectional view of the exemplary semiconductor structure of FIG. 5A after forming a vestigial antenna removal mask.

Referring now to FIGS. 6A-6B, there are illustrated the exemplary semiconductor structure of FIGS. 5A-5B, respectively, after forming a vestigial antenna removal mask 28. Vestigial antenna removal mask 28 is formed along sidewalls of each extended cavity 22E that abuts one of the device regions. The vestigial antenna removal mask 28 has an opening that is present above the sacrificial gate material 16' that is present above the vestigial antenna 24. The vestigial antenna removal mask 28 may be formed by deposition of a mask material and then patterning the mask material. In one example, the mask material used to provide the vestigial antenna removal mask 28 is a photoresist and patterning of the mask material is performed by photolithography. The vestigial antenna removal mask 28 covers portions of the dielectric material liner 26, while leaving other portions of the dielectric material liner 26 exposed.

Figure 7:
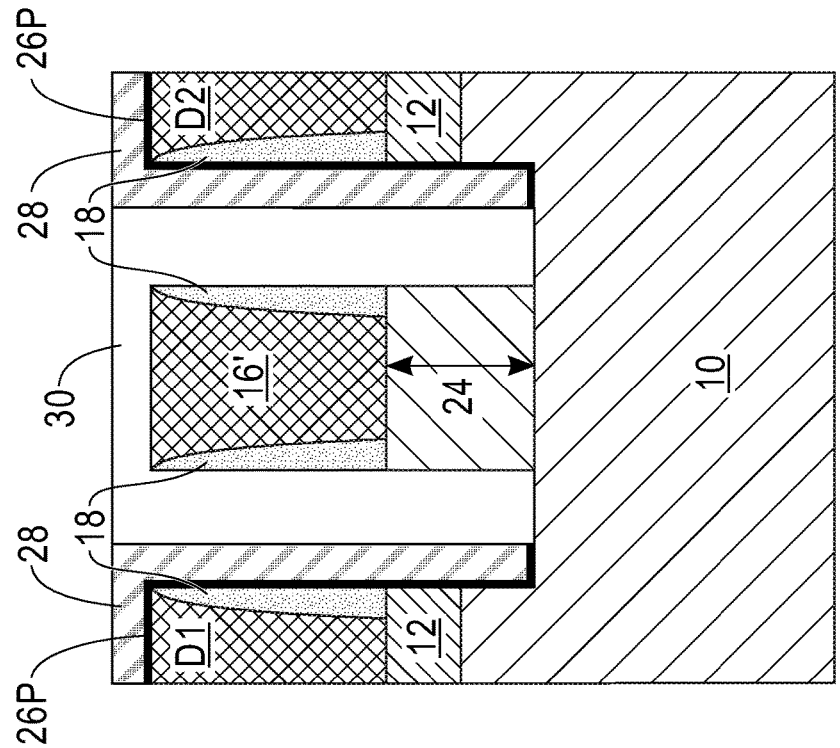
FIG. 7 is a cross sectional view of the exemplary semiconductor structure of FIG. 6A after removing the physically exposed portions of the dielectric material liner.

Referring now to FIG. 7, there is illustrated the exemplary semiconductor structure of FIG. 6A after removing the physically exposed portions of the dielectric material liner 26 utilizing the vestigial antenna removal mask 28 as an etch mask. The physically exposed portions of the dielectric material liner 26 that are not covered by the vestigial antenna removal mask 28 are removed utilizing an etching process that is selective in removing the dielectric material that provides the dielectric material liner 26. The dielectric material liner 26 that remains after this etch may be referred to as a dielectric material liner portion 26P.

Figure 8:
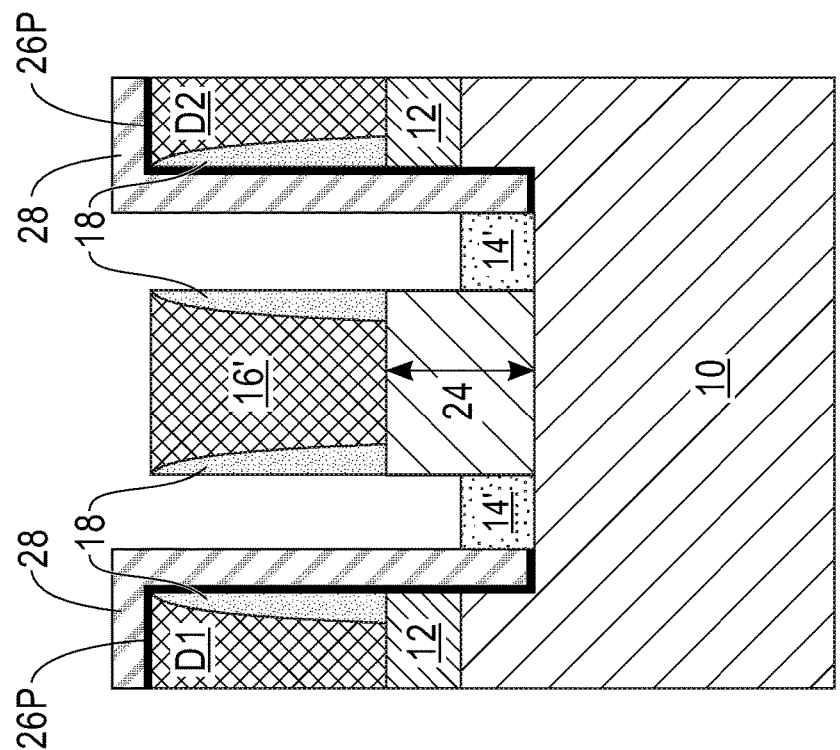
FIG. 8 is a cross sectional view of the exemplary semiconductor structure of FIG. 7 after forming a germanium structure, wherein a portion of the germanium structure directly contacts the vestigial antenna.

Referring now to FIG. 8, there is illustrated the exemplary semiconductor structure of FIG. 7 after forming a germanium structure 30, wherein a portion of the germanium structure 30 directly contacts the vestigial antenna 24. In one embodiment, the germanium structure 30 includes pure (i.e., unalloyed) germanium. In another embodiment, the germanium structure 30 includes a germanium-containing material such as, for example, a SiGe alloy, in which the germanium content is from 20 atomic percent germanium to 99.99 atomic percent germanium. The germanium structure 30 can be formed utilizing a deposition process such as, for example, physical vapor deposition (PVD) or sputtering. The germanium structure 30 fills in the remaining volume of the extended cavity 22E (a portion of the extend cavity 22E includes part of the vestigial antenna removal mask 28 and a dielectric material liner portion 26P) and has a top portion that extends above the topmost surface of sacrificial gate material 16' that is present above the vestigial antenna 24.

Figure 9:
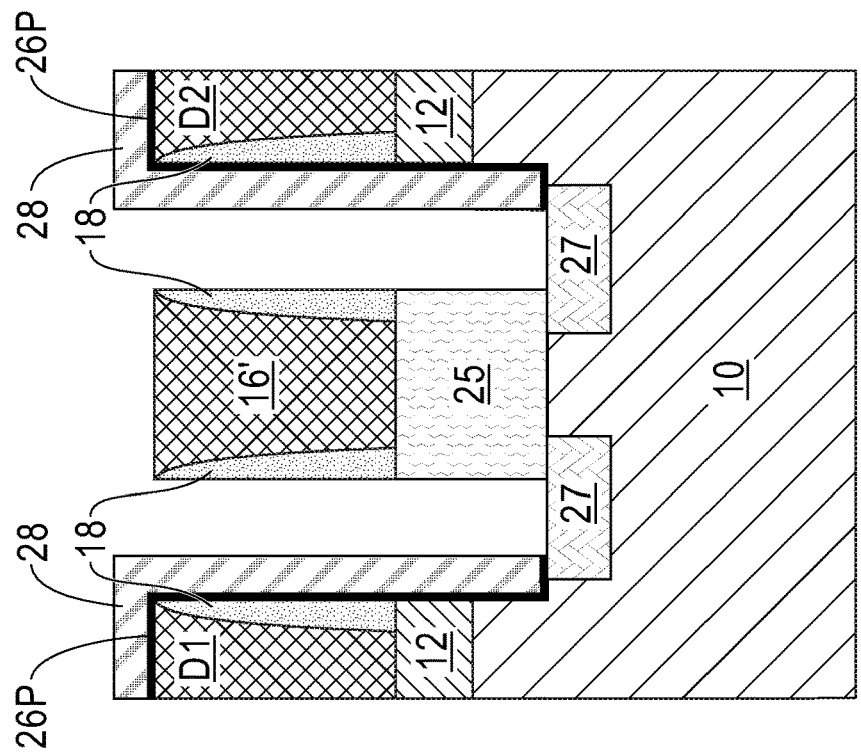
FIG. 9 is a cross sectional view of the exemplary semiconductor structure of FIG. 8 after performing an anneal to cause germanium diffusion out of the germanium structure and into at least the vestigial antenna so as to convert the vestigial antenna into a SiGe vestigial antenna.

Referring now to FIG. 9, there is illustrated the exemplary semiconductor structure of FIG. 8 after performing an anneal to cause germanium diffusion from the germanium structure 30 into at least the vestigial antenna 24 so as to convert the vestigial antenna 24 into a SiGe vestigial antenna 25. In some embodiments, and when the substrate 10 is composed of silicon, germanium also diffuses into exposed portions of the substrate 10 forming SiGe substrate regions 27. After annealing, the germanium structure 30 has a lower germanium content than the germanium structure 30 prior to annealing.

In some embodiments, the anneal may be performed at a temperature from 850° C. to 1200° C. in an inert ambient such as, for example helium and/or argon. The anneal may include a furnace anneal, a rapid thermal anneal or a laser anneal. The duration of the anneal may vary depending on the type of anneal process employed; finance anneals usually require longer annealing times that rapid thermal annealing or laser annealing.

The SiGe vestigial antenna 25 and, when formed, the SiGe substrate regions 27 have a germanium content which may range from 10 atomic percent germanium to 30 atomic percent germanium. The SiGe vestigial antenna 25 may have a uniform Ge content or a graded Ge content. When a graded Ge content is formed, the SiGe vestigial antenna 25 has a highest germanium content at the interface between the germanium structure 30 and the SiGe vestigial antenna 25 which decreases laterally inward (i.e., horizontally) from this interface. Likewise, the SiGe substrate regions 27 may have a uniform Ge content or a graded Ge content. When a graded Ge content is formed, the SiGe substrate regions 27 have a highest germanium content at the interface between the germanium structure 30 and the substrate 10 which decreases downward (i.e., vertically) from this interface.

Figure 10:
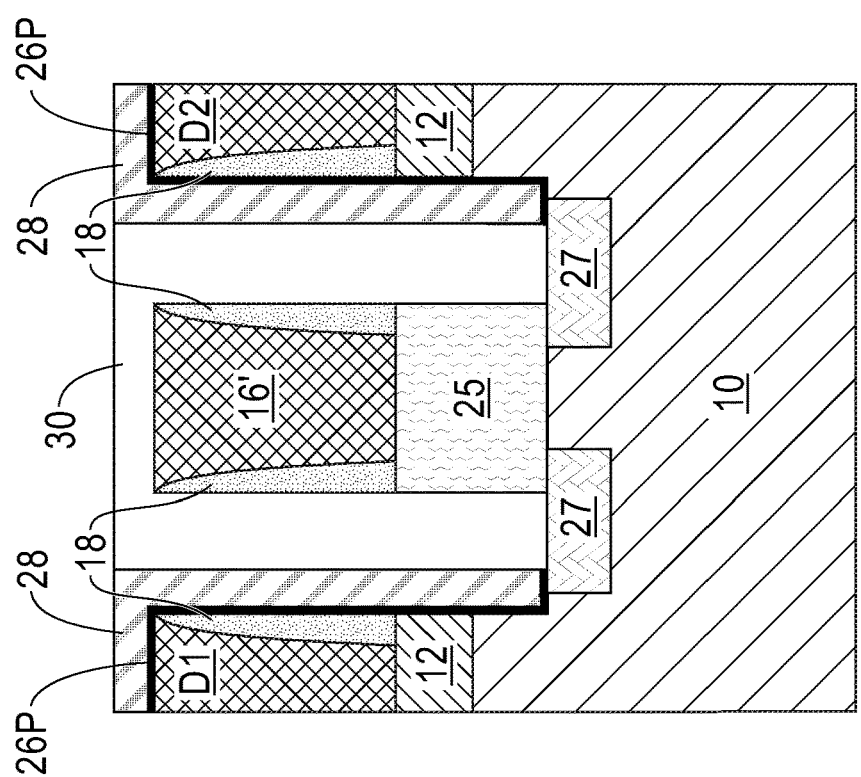
FIG. 10 is a cross sectional view of the exemplary semiconductor structure of FIG. 9 after removing the germanium structure.

Referring now FIG. 10, there is illustrated the exemplary semiconductor structure of FIG. 9 after removing the germanium structure 30. The germanium structure 30 may be removed utilizing an etch that is selective for removing the germanium or a germanium-containing material. In one example, the germanium structure 30 may be removed utilizing a mixture of hydrogen peroxide and water.

Referring now to FIG. 11, there is illustrated the exemplary semiconductor structure of FIG. 10 after removing the entirety of the SiGe vestigial antenna 25, and if formed, the SiGe substrate regions 27. A space 32 is formed beneath the sacrificial gate material 16' and the substrate 10; in the drawing element 14' denotes an isolation structure present in the background of the structure. The SiGe vestigial antenna 25, and if formed, the SiGe substrate regions 27 are removed utilizing an etch that is selective for removing silicon germanium. In one example, HCl gas may be used to remove the SiGe vestigial antenna 25, and if formed, the SiGe substrate regions 27.

Referring now to FIG. 12, there is illustrated the exemplary structure of FIG. 11 after removing the vestigial antenna removal mask 28 and the remaining portions of the dielectric material liner (i.e., the dielectric material liner portions 26P). In some embodiments the vestigial antenna removal mask 28 may be removed in a first removal step, followed by the removal of the dielectric material liner portions 26P in a second removal step. In such an embodiment, the first removal step differs from the second removal step. In one example, the first removal step may include ashing, while the second removal step may include a wet etch that is selective in removing the dielectric material that provides the dielectric material liner 26. In another embodiment, the vestigial antenna removal mask 28 and the dielectric material liner portions 26P may be removed utilizing a single removal process.

Figure 13B:
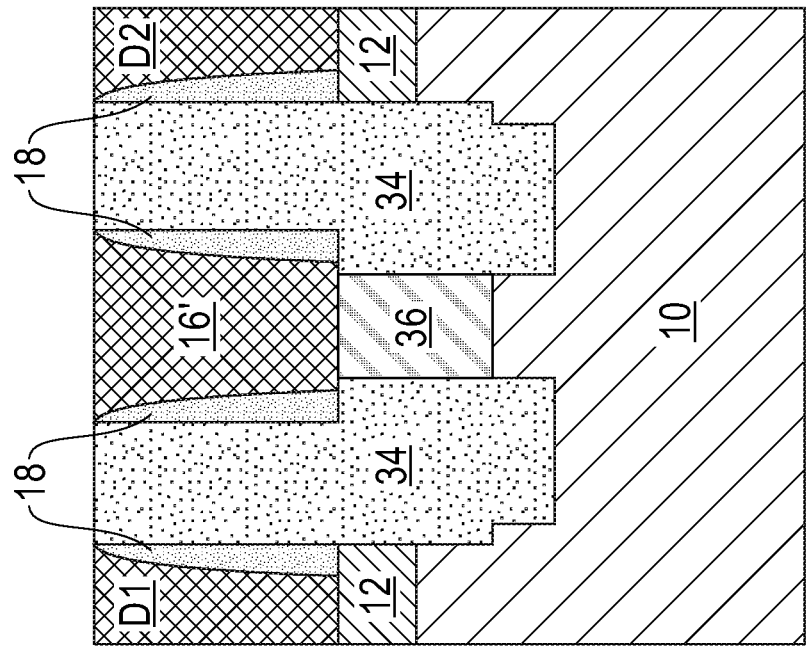
FIG. 13B is a cross sectional view of the exemplary structure of FIG. 12 after depositing an interlevel dielectric (ILD) material in accordance with another embodiment of the present application.
Figure 13A:
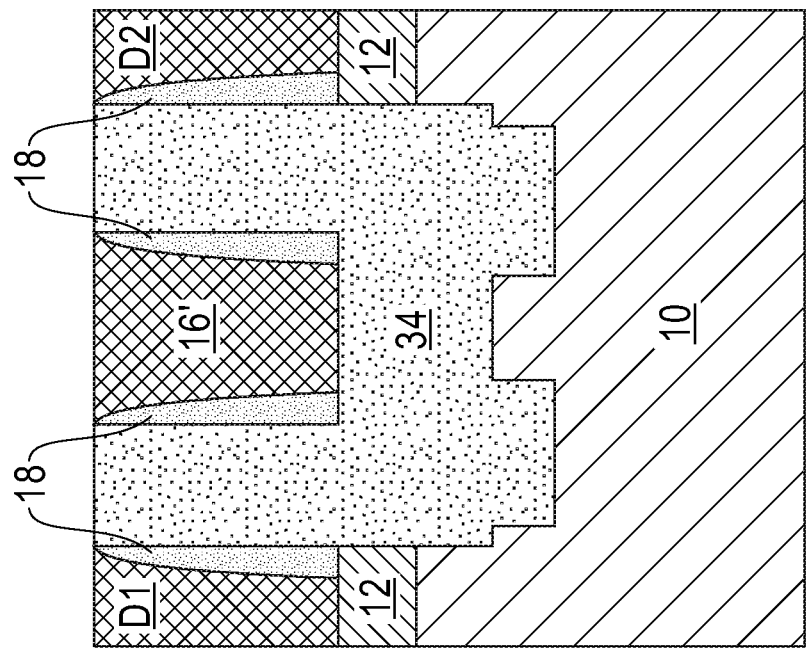
FIG. 13A is a cross sectional view of the exemplary structure of FIG. 12 after depositing an interlevel dielectric (ILD) material in accordance with an embodiment of the present application.

Referring now to FIG. 13A, there is illustrated the exemplary structure of FIG. 12 after depositing an interlevel dielectric (ILD) material 34 in accordance with an embodiment of the present application. In this embodiment, the interlevel dielectric (ILD) material 34 completely fills in space 32. FIG. 13B illustrates an embodiment, in which the interlevel dielectric (ILD) material 34 partially fills space 32. In such an embodiment, the interlevel dielectric (ILD) material 34 pinches of the space 32 and a void 36 remains. In either embodiment, the interlevel dielectric (ILD) material 34 completely fills in the extended cavity and any additional portion that is provided by removing the SiGe substrate regions 27 and has a topmost surface that is coplanar with the sacrificial gate material 16'.

The ILD material 34 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 34. The use of a self-planarizing dielectric material as the ILD material 50 may avoid the need to perform a subsequent planarizing step.

In one embodiment, the ILD material 34 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 34, a planarization process or an etch back process follows the deposition of the dielectric material that provides the ILD material 34.

FIGS. 13A and 13B illustrate exemplary structures of the present application in which the vestigial antenna has been removed therefrom. Notably, FIGS. 13A and 13B illustrates a semiconductor structure that includes a first device region, D1, containing a first conductivity type field effective transistor straddling over a channel region of a silicon fin. The structure further includes a second device region, D2, containing a second conductivity type field effective transistor straddling over a channel region of a silicon fin. In accordance with the present application, a double diffusion break (DDB) region is located between the first and second device regions (D1 and D2). The double diffusion break region includes a sacrificial gate material 16' and an interlevel dielectric material 34 that is present adjacent to each side of the sacrificial gate material and beneath at least a portion of the sacrificial gate material 16'.

In some embodiments of the present application (not shown), a gas phase doping or implantation process can be used to provide a dopant to the vestigial antenna 24 shown in FIG. 7; gas phase doping or implanting is used in place of forming the germanium structure 30. The dopant may include any dopant such as, for example, arsine or germanium, which changes the etch selectivity of the vestigial antenna 24 such that the doped vestigial antenna may be etched at a faster rate than silicon. In one embodiment, a cyclic doping/implant process followed by etching may be used to remove the doped vestigial antenna. These steps may be repeated any number of times to ensure completely removal of the vestigial antenna 24. A structure such as shown in FIG. 11 is formed, and then the processing as described in FIGS. 12, 13A and 13B may be performed.

In yet embodiments of the present application (not shown), the structure shown in FIG. 7 is first provided. Next, the vestigial antenna 24 is removed without any treatments utilizing an etchant such as, for example, HCl, so as to provide the structure shown in FIG. 11. Next, the processing as described in FIGS. 12, 13A and 13B may be performed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   providing an initial structure including a first device region defined by a first portion of a silicon fin, and a second device region defined by a second portion of the silicon fin, wherein a double diffusion break region is located between the first and second device regions and defined by a third portion of the silicon fin, wherein the double diffusion break region includes sacrificial gate cut structures which are present between opposing gate spacers, and a sacrificial gate material that is located between each sacrificial gate cut structure;
   removing each sacrificial gate cut structure to provide a cavity that physically exposes a portion of the silicon fin in the double diffusion break region;
   cutting the silicon fin by removing the physically exposed portions of the silicon fin in each cavity in the double diffusion break region, while maintaining a portion of the silicon fin beneath the sacrificial gate material, wherein the portion of the silicon fin that remains beneath the sacrificial gate material defines a vestigial antenna;
   removing the entirety of the vestigial antenna to provide a space beneath the sacrificial gate material; and
   filling at least a portion of the space beneath the sacrificial gate material and an entirety of each cavity with an interlevel dielectric material.

2. The method of claim 1, wherein the space is entirely filled with the interlevel dielectric material.

3. The method of claim 2, wherein the interlevel dielectric material has a topmost surface that is coplanar with a topmost surface of the sacrificial gate material.

4. The method of claim 1, wherein the space is partially filled with the interlevel dielectric material and a void is formed beneath the sacrificial gate material.

5. The method of claim 4, wherein the interlevel dielectric material has a topmost surface that is coplanar with a topmost surface of the sacrificial gate material.

6. The method of claim 1, wherein the removing the entirety of the vestigial antenna comprises:
   forming a dielectric material liner at least within the double diffusion break region;
   forming a vestigial antenna removal mask atop the dielectric material liner, wherein the vestigial antenna removal mask includes an opening located above the sacrificial gate material;
   removing exposed portions of the dielectric material liner not protected by the vestigial antenna removal mask to physically expose a sidewall surface of the vestigial antenna;
   forming a germanium structure that contacts the physically exposed sidewall surface of the vestigial antenna;
   performing an anneal to cause diffusion of germanium atoms from the germanium structure into the vestigial antenna so as to convert the vestigial antenna into a SiGe vestigial antenna;
   removing the SiGe vestigial antenna; and
   removing the vestigial antenna removal mask and remaining portions of the dielectric material liner.

7. The method of claim 6, wherein during the anneal germanium atoms also diffuse into an underlying portion of substrate that is located beneath the silicon fin to provide a SiGe substrate portion.

8. The method of claim 7, wherein the removing the SiGe vestigial antenna also removes the SiGe substrate portion.

9. The method of claim 1, wherein the removing the entirety of the vestigial antenna comprises:
   forming a dielectric material liner at least within the double diffusion break region;
   forming a vestigial antenna removal mask atop the dielectric material liner, wherein the vestigial antenna removal mask includes an opening located above the sacrificial gate material;
   removing exposed portions of the dielectric material liner not protected by the vestigial antenna removal mask to physically expose a sidewall surface of the vestigial antenna;
   introducing a dopant into the vestigial antenna to provide a doped vestigial antenna, wherein the doped vestigial antenna has a higher etch rate than silicon;
   removing the doped vestigial antenna; and
   removing the vestigial antenna removal mask and remaining portions of the dielectric material liner.

10. The method of claim 1, wherein the removing the entirety of the vestigial antenna comprises:
    etching the vestigial antenna utilizing HCl gas, wherein the etching is performed without any pretreatment of the vestigial antenna.

* * * * *